(12) United States Patent
Wang et al.

(10) Patent No.: US 11,621,573 B2
(45) Date of Patent: Apr. 4, 2023

(54) DROOPING CELL DETECTION AND STATE OF CELL HEALTH MONITORING

(71) Applicant: GM Global Technology Operations LLC, Detroit, MI (US)

(72) Inventors: Yue-Yun Wang, Troy, MI (US); Chaitanya Sankavaram, Rochester Hills, MI (US); Garrett M Seeman, Novi, MI (US); Azeem Sarwar, Rochester Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 218 days.

(21) Appl. No.: 17/085,394

(22) Filed: Oct. 30, 2020

(65) Prior Publication Data

US 2022/0140617 A1 May 5, 2022

(51) Int. Cl.
*H02J 7/00* (2006.01)
*G01R 31/3835* (2019.01)
*G01R 31/392* (2019.01)

(52) U.S. Cl.
CPC .......... *H02J 7/005* (2020.01); *G01R 31/3835* (2019.01); *G01R 31/392* (2019.01); *H02J 7/007* (2013.01); *H02J 7/0013* (2013.01)

(58) Field of Classification Search
CPC .......... H02J 7/005; H02J 7/0013; H02J 7/007; H02J 7/007182; G01R 31/3835; G01R 31/392; G01R 31/367; G01R 31/396; Y02T 10/70; B60L 58/16
See application file for complete search history.

(56) References Cited

U.S. PATENT DOCUMENTS

| | | | |
|---|---|---|---|
| 2015/0357852 A1* | 12/2015 | Nakao | H01M 10/48 702/63 |
| 2016/0187431 A1* | 6/2016 | Yamamoto | H01M 10/4285 324/426 |
| 2019/0036178 A1* | 1/2019 | Karner | G06Q 50/06 |
| 2019/0204393 A1* | 7/2019 | Yamada | G01R 31/392 |
| 2021/0226462 A1* | 7/2021 | Seo | G01R 31/392 |
| 2021/0231745 A1* | 7/2021 | Nagai | H01M 10/486 |
| 2021/0265674 A1* | 8/2021 | Doczy | G01R 31/396 |
| 2022/0137153 A1* | 5/2022 | Morita | G01R 31/392 702/63 |
| 2022/0140617 A1* | 5/2022 | Wang | H02J 7/005 320/134 |
| 2022/0239119 A1* | 7/2022 | Liu | H01M 10/0525 |
| 2023/0018662 A1* | 1/2023 | Roemersperger | H01M 10/441 |

\* cited by examiner

*Primary Examiner* — Nha T Nguyen
(74) *Attorney, Agent, or Firm* — Vivacqua Crane PLLC

(57) ABSTRACT

A method is disclosed for determining the state of health of an electric battery that includes a plurality of battery cells. The method includes the steps of measuring the cell voltage of each individual cell of the plurality of battery cells, and analyzing each measured battery cell voltage to determine the state of health of the corresponding battery cell.

20 Claims, 3 Drawing Sheets

DROOPING CELL DETECTION AND STATE OF CELL HEALTH MONITORING

INTRODUCTION

The present disclosure relates generally to rechargeable energy storage systems (RESS), such as battery packs in vehicles.

Automotive vehicles are available that use an RESS, such as a battery pack, to store large amounts of energy to provide propulsion to the vehicle. These vehicles may include, for example, plug-in hybrid electric vehicles, electric vehicles with an internal combustion engine that is used as a generator for battery charging, and battery-electric vehicles. A vehicle battery pack commonly uses a plurality of battery cells in series to achieve a battery pack voltage compatible with the voltage requirements of a traction motor used for vehicle propulsion. To maximize the driving range of the vehicle and the life of a battery pack, it is desirable to monitor the state of health of the battery cells in the battery pack.

While electric vehicle systems achieve their intended purpose, there is a need for a new and improved system and method for monitoring the state of health of the battery cells in a battery pack and to manage the battery system accordingly.

SUMMARY

According to several aspects, a method is disclosed for determining a state of health of an electric battery pack that includes a plurality of battery cells. The method includes the steps of measuring the cell voltage of each individual battery cell of the plurality of battery cells, and analyzing each measured battery cell voltage to determine the state of health of the corresponding battery cell.

In an additional aspect of the present disclosure, the step of analyzing each measured battery cell voltage includes the steps of determining the mean of the individual measured cell voltages in the battery pack, determining a residual voltage value for each of the individual battery cells, wherein the residual voltage value is calculated as the numerical difference between the measured voltage for the particular individual battery cell and the determined mean, and calculating the standard deviation of the determined residual voltage values at each measurement time. The step of analyzing each measured battery cell voltage further includes identifying an outlier battery cell as a battery cell whose residual voltage value exceeds a predetermined multiple of the standard deviation for a predetermined period of time, and performing a first action upon identifying at least one outlier battery cell.

In another aspect of the present disclosure, the first action includes setting a diagnostic indicator.

In a further aspect of the present disclosure, the first action upon identifying at least one outlier battery cell includes derating maximum power delivered from the battery.

In an additional aspect of the present disclosure, the first action includes calculating a reduced value of remaining energy available from the battery based on an estimate of energy available from the outlier battery cell.

In another aspect of the present disclosure, the first action includes reducing an allowable charging rate of the battery compared to a charging rate that is allowed for a battery having no outlier battery cells.

According to aspects of the present disclosure, the first action includes determining a second mean as the mean of the individual measured voltages excluding voltages associated with all battery cells identified as outlier battery cells, and determining a second residual voltage value for each of the battery cells not identified as outlier battery cells, wherein the second residual voltage value is calculated as the numerical difference between the measured voltage for the particular non-outlier individual battery cell and the determined second mean. The first action further includes calculating a second standard deviation at each measurement time as the standard deviation of the determined second residual voltage values for the non-outlier battery cells, identifying a drooping cell as a battery cell whose second residual voltage value exceeds a predetermined multiple of the second standard deviation, and performing a second action upon identifying at least one drooping cell.

In another aspect of the present disclosure, the second action includes setting a diagnostic indicator.

In an additional aspect of the present disclosure, the second action includes derating maximum power delivered from the battery.

In yet another aspect of the present disclosure, the second action includes calculating a reduced value of remaining energy available from the battery based on an estimate of energy available from the drooping cell.

In another aspect of the present disclosure, the second action includes reducing an allowable charging rate of the battery compared to a charging rate that is allowed for a battery having no drooping cells.

According to several aspects of the present disclosure, analyzing each measured battery cell voltage includes identifying a battery cell corresponding to the lowest measured battery cell voltage of the plurality of battery cells, determining whether the battery cell corresponding to the lowest measured battery cell voltage has an output voltage that remains below a predetermined threshold voltage for a time duration greater than a predetermined threshold time duration, and performing a third action if the battery cell corresponding to the lowest measured battery cell voltage has an output voltage that remains below the predetermined threshold voltage for a time duration greater than the predetermined threshold time duration.

In another aspect of the present disclosure, the third action includes analyzing the battery cell voltage of a battery cell adjacent to the battery cell corresponding to the lowest measured battery cell voltage to determine if the adjacent battery cell is showing indications of cell droop.

In an additional aspect of the present disclosure, the third action includes comparing a battery pack temperature, a rate of rise of the battery pack temperature, a battery cell temperature, a rate of rise of the battery cell temperature, a battery pack pressure, and/or a rate of rise of the battery pack pressure to a predetermined threshold value.

In another aspect of the present disclosure, the third action includes activating a warning signal.

According to several aspect of the present disclosure, analyzing each measured battery cell voltage includes estimating a battery cell resistance value during constant charging or discharging conditions using a rolling average algorithm, a Kalman filter, or a recursive least square algorithm, and performing a fourth action if the estimated battery cell resistance value exceeds a predetermined threshold.

According to another aspect of the present disclosure, the fourth action includes setting a diagnostic indicator.

According to an additional aspect of the present disclosure, the fourth action includes derating maximum power delivered from the battery.

According to a further aspect of the present disclosure, n the fourth action includes calculating a reduced value of remaining energy available from the battery.

According to another aspect of the present disclosure, the fourth action includes reducing an allowable charging rate of the battery compared to a charging rate that is allowed for a battery having no cells with an estimated battery cell resistance value exceeding the predetermined threshold.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Automotive vehicles are available that use an RESS, such as a battery pack, to store large amounts of energy to provide propulsion to the vehicle. These vehicles may include, for example, a plug-in hybrid electric vehicle (EV), electric vehicles with an internal combustion engine that is used as a generator for battery charging, and battery-electric vehicles. A vehicle battery pack commonly uses a plurality of battery cells in series to achieve a battery pack voltage compatible with the voltage requirements of a traction motor used for vehicle propulsion. Battery packs used in vehicles are commonly configured with battery cells in series, and several of those battery packs can be connected in parallel to provide more power to the vehicle. In a non-limiting example, a battery pack may use Li-ion battery cells with a nominal voltage of 4.2 volts. The battery pack may use 96 of these 4.2 volt cells in series to produce a battery pack voltage of 400 volts nominal.

Battery cells are susceptible to degradation due to manufacturing defects, charge-discharge cycles, and their calendar life over time. Degradation can result in increased internal resistance and decrease in storage capacity. While degradation at some normal rate is not unexpected, variation in materials, manufacturing tolerances, or environmental stress in use may result in a particular battery cell in a multi-cell battery pack to experience a level of degradation beyond the level of degradation experienced by other battery cells in the battery pack. A higher degree of degradation in a single battery cell may result in reduced energy storage capacity of the battery pack, thereby limiting driving range of an electric vehicle. More severe degradation may result in thermal damage to the battery cell, possibly extending to adjacent battery cells in the battery pack. The degree of degradation may be expressed as a state of health of the battery pack. As used herein, the term "state of health' refers to a measure of the battery's ability to store and deliver electrical energy, compared with a new battery.

Figure 1:
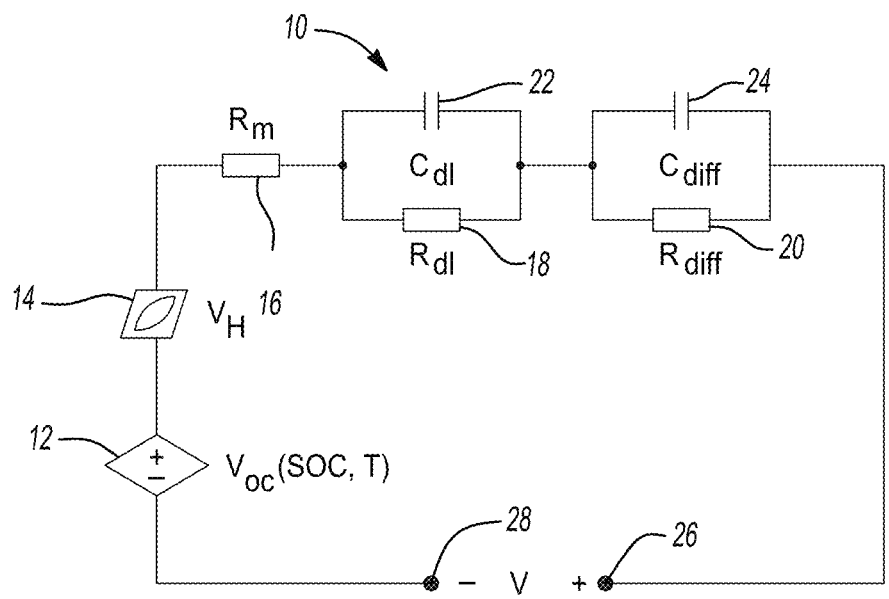
FIG. 1 is a depiction of an equivalent circuit model of an electrochemical cell according to an exemplary embodiment.

Referring to FIG. 1, a depiction of an electrochemical cell 10 is presented with elements of an equivalent circuit model of the electrochemical cell 10 shown. The model includes an ideal voltage source 12 having an open circuit voltage Voc. The open circuit voltage Voc is a function of the cell state of charge (SOC) and the cell temperature T. As used herein, the term "state of charge" is understood to represent the level of charge of an electric battery cell relative to its capacity. With continued reference to FIG. 1, the model of the electrochemical cell 10 includes a hysteresis model 14 to account for the behavior of chemical processes taking place during battery charging and battery discharging. The model also includes a first resistor 16, which represents ohmic resistance Rm in the electrochemical cell. The model of the electrochemical cell 10 further includes a second resistor 18 in parallel with a first capacitor 22 defining a first RC time constant. The second resistor 18 represents double layer resistance Rdl and the first capacitor 22 represents double layer capacitance Cdl. The model of the electrochemical cell 10 also includes a third resistor 20 in parallel with a second capacitor 24 defining a second RC time constant. The third resistor 20 represents diffusion resistance Rdiff and the second capacitor 24 represents diffusion capacitance Cdiff. Resistance values of the modeled resistors 16, 18, 20, and capacitance values of the modeled capacitors 22, 24, are chosen to closely match observed steady-state and transient behavior of the electrochemical cell 10. The output voltage of the electrochemical cell 10 appears at the first output terminal 26 with respect to the second output terminal 28.

Degradation of an electrochemical cell may be exhibited as cell droop, which as used herein means a decrease in cell output voltage when sourcing a current and/or an increase in cell voltage when current is supplied to the cell for charging. Cell droop is correlated to an increase in the internal resistances Rm, Rdl, and/or Rdiff. Cell droop may also be correlated to a decrease in the capacity of the cell to deliver electrical energy.

Figure 2:
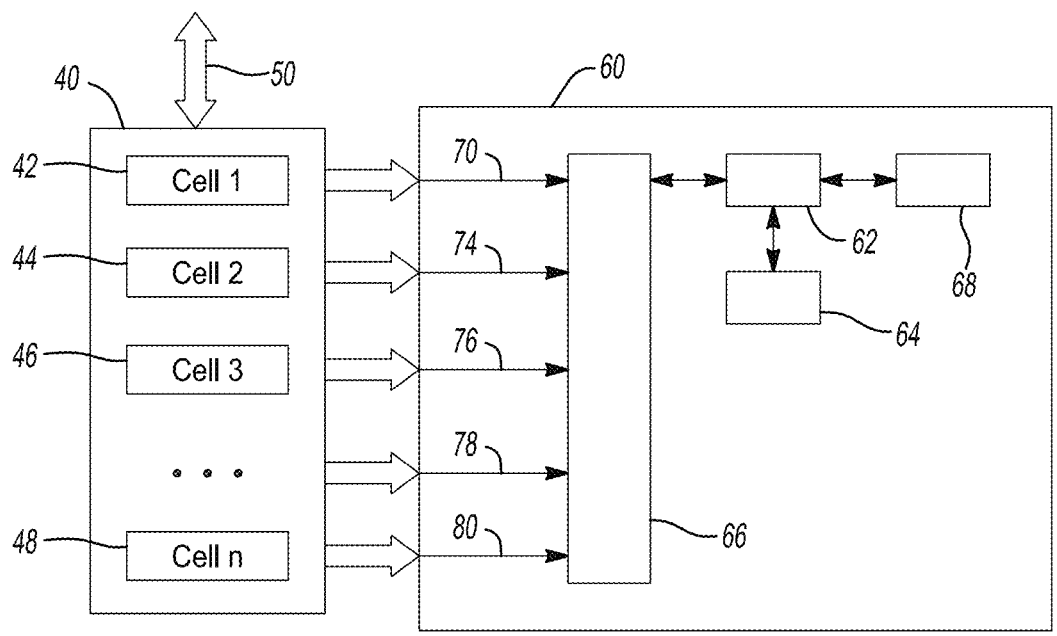
FIG. 2 is a depiction of an electrical architecture that includes a battery pack containing a plurality of battery cells according to an exemplary embodiment.

Referring to FIG. 2, a battery pack 40 is shown having a plurality of n battery cells, including a first battery cell 42, a second battery cell 44, a third battery cell 46, and so forth to an nth battery cell 48. Each of the plurality of battery cells may be implement as an electrochemical cell 10 as shown in FIG. 1. Alternatively, each of the battery cells 42, 44, 46 . . . 48 may be implemented as a plurality of electrochemical cells 10 connected in parallel. In a non-limiting example, each of the battery cells 42, 44, 46 . . . , 48 may contain three electrochemical cells 10 connected in parallel. The battery cells in the battery pack 40 are electrically connected in series so that the nominal battery pack voltage is n times the cell voltage of each individual battery cell. In a non-limiting example, a battery pack 40 may contain 96 battery cells in series, with each battery cell having a nominal rated voltage of 4.2 volts, so as to produce a nominal 400 volts from the battery pack 40. Current may be supplied to the battery pack 40 during charging, or supplied from the battery pack 40 to a load (not shown), as indicated by the arrow 50. It is to be understood that, while the battery pack 40 is depicted as a single entity containing all of the battery cells 42, 44, 46 . . . 48, as an alternative the battery cells 42, 44, 46 . . . , 48 may be partitioned into a plurality of battery modules, with each module having one or more battery cells electrically connected in series and each module electrically connected in series with other modules, without departing from the scope of the disclosure.

With continued reference to FIG. 2, a controller 60 receives voltage measurements from the first battery cell 42, the second battery cell 44, the third battery cell 46 and so forth through the nth battery cell 48. The controller 60 is a non-generalized, electronic control device having a preprogrammed digital computer or processor 62, memory or non-transitory computer readable medium 64 used to store data such as control logic, software applications, instructions, computer code, data, lookup tables, etc. The controller 60 is also shown with input ports 66 and output ports 68. The computer readable medium 64 includes any type of medium capable of being accessed by a computer, such as read only memory (ROM), random access memory (RAM), a hard disk drive, a compact disc (CD), a digital video disc (DVD), or any other type of memory. A "non-transitory" computer readable medium 64 excludes wired, wireless, optical, or other communication links that transport transitory electrical or other signals. A non-transitory computer readable medium 64 includes media where data can be permanently stored and media where data can be stored and later overwritten, such as a rewritable optical disc or an erasable memory device. Computer code includes any type of program code, including source code, object code, and executable code. The processor 62 is configured to execute the code or instructions. The code or instructions may be stored within the memory 64 or in additional or separate memory. It is to be understood that elements depicted in the block diagram of controller 60 may alternatively be physically implemented in one or separate modules operatively connected to the controller 60 without departing from the spirit of the disclosure. The elements that execute computer code may be implemented remote from the vehicle, for example with required data sets sent to the cloud, algorithms executed by servers in the cloud, and results communicated from the cloud back to the vehicle. As used herein, the term "cloud" refers to networked computing facilities providing remote data storage and processing services.

As conceptually shown in FIG. 2, the input ports 66 receive a first signal 70 representing the measured voltage of the first battery cell 42, a second signal 74 representing the measured voltage of the second battery cell 44, a third signal 76 representing the measured voltage of the third battery cell 46, and a fourth signal 80 representing the measured voltage of the nth battery cell 48. FIG. 2 also depicts the input ports 66 receiving a group of signals 78 representing measured voltages of the fourth battery cell (not shown) through the (n−1)th battery cell (not shown).

Figure 3:
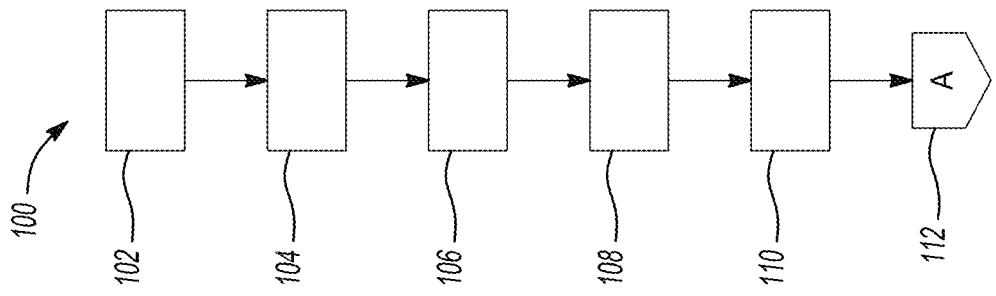
FIG. 3 is a flowchart of an algorithm for detecting an outlier battery cell in the battery pack according to an exemplary embodiment.

Referring to FIG. 3, a flowchart of an algorithm 100 for detecting an outlier battery cell in the battery pack 40 is presented. In algorithm step 102, each of the battery cell voltages is measured at a time t. In algorithm step 104, the mean battery cell voltage is calculated. If the measured voltage of the ith battery cell at time t is represented as $Vcell_i(t)$, the mean battery cell voltage $Vc\_m(t)$ is calculated as $Vc\_m(t) = \sum_{i=1}^{n} Vcell_i(t)/n$.

The algorithm 100 then proceeds to step 106 where an array of residuals is calculated. For each of the n battery cells, the residual $e_i(t)$ is calculated as $e_i(t) = Vcell_i(t) - Vc\_m(t)$; $i=1, 2 \ldots n$. In step 108, the standard deviation $\sigma(t)$ of all of the residuals $e_i(t)$ calculated in step 106 is calculated as $\sigma(t) = std(e_i(t); i=1, 2 \ldots n)$.

In algorithm step 110 each of the individual residual values $e_i(t)$ is compared to a multiplier $k(I)$ times the standard deviation of the residuals calculated in step 108 to identify outlier battery cells. The value of the multiplier $k(I)$ is a function of battery cell current I, and by way of non-limiting example may be in the range $2 < k(I) < 4$. If the battery pack was charging when the battery cell voltage measurements were made in step 102, the ith battery cell is identified as an outlier battery cell if $e_i(t) > k(I)\sigma(t)$. If the battery was discharging when the cell voltage measurements were made in step 102, the ith battery cell is identified as an outlier battery cell if $e_i(t) < -k(I)\sigma(t)$. The multiplier value $k(I)$ may be the same or may be different for the charging and discharging cases. Following identification of outlier battery cells in step 110, further analysis may be performed as will be explained with respect to FIG. 3 and FIG. 4. Connector block 112 in FIGS. 3, 4, and 5 indicates linkage between algorithm 100 in FIG. 3 and the algorithms described in FIG. 4 and FIG. 5.

Figure 4:
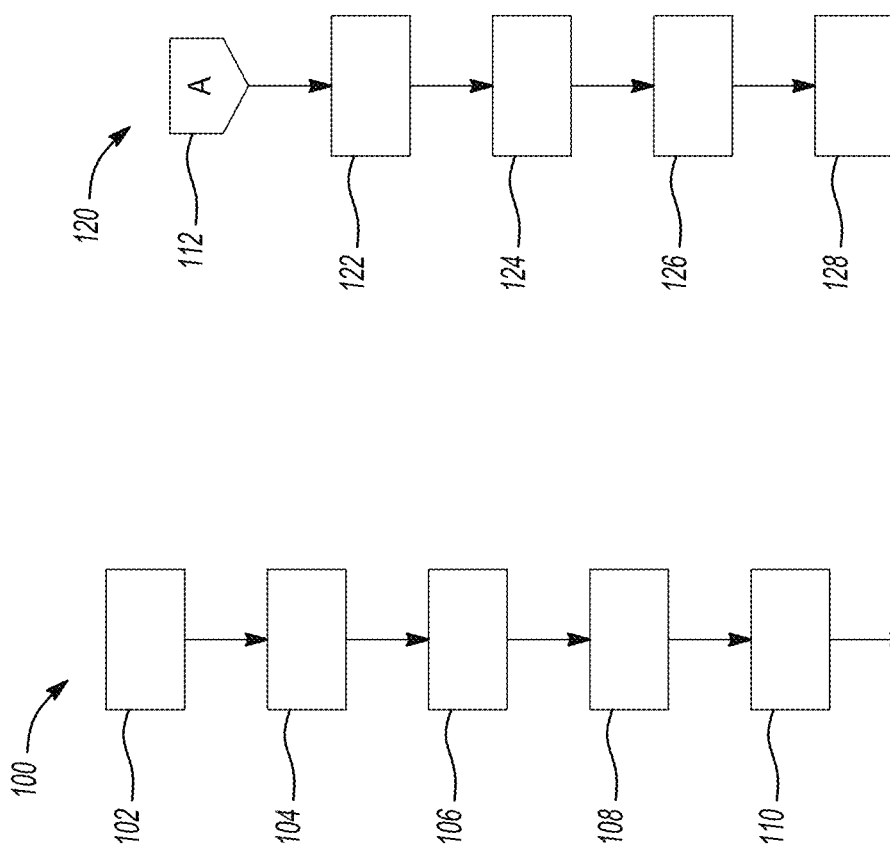
FIG. 4 is a flowchart of an algorithm for detecting a drooping battery cell in the battery pack according to an exemplary embodiment.

FIG. 4 which depicts a flowchart of an exemplary algorithm 120 for identifying a drooping cell using the results determined in the algorithm 100 depicted in FIG. 3 as linked by connector block 112. The algorithm 120 executes step 122, where the mean battery cell voltage $Vc\_m(t)$ is recalculated as in step 104 except with battery cells identified as outliers in step 110 excluded from the calculation. The algorithm 120 proceeds to step 124 where residuals are calculated as in step 108 except using the mean battery cell voltage with outliers excluded calculated in step 122 instead of the original mean calculated in step 104. In step 126 the standard deviation of the residuals calculated in step 124 is calculated, using only the residual values of battery cells that were not identified as outliers in step 110.

In algorithm step 128 each of the individual residual values $e_i(t)$ calculated in step 124 is compared to a multiplier $k(I)$ times the standard deviation of the residuals calculated in step 126 to identify weak or drooping cells. If the battery was charging when the battery cell voltage measurements were made in step 102, the ith battery cell is identified as a weak or drooping cell if $e_i(t) > k(I)\sigma(t)$. If the battery was discharging when the battery cell voltage measurements were made in step 102, the ith cell is identified as a weak or drooping cell if $e_i(t) < -k(I)\sigma(t)$. The multiplier value k may be the same or may be different for the charging and discharging cases. Additionally, the multiplier value k may be the same as or may be different from a multiplier value k used in the calculations in algorithm step 110.

Figure 5:
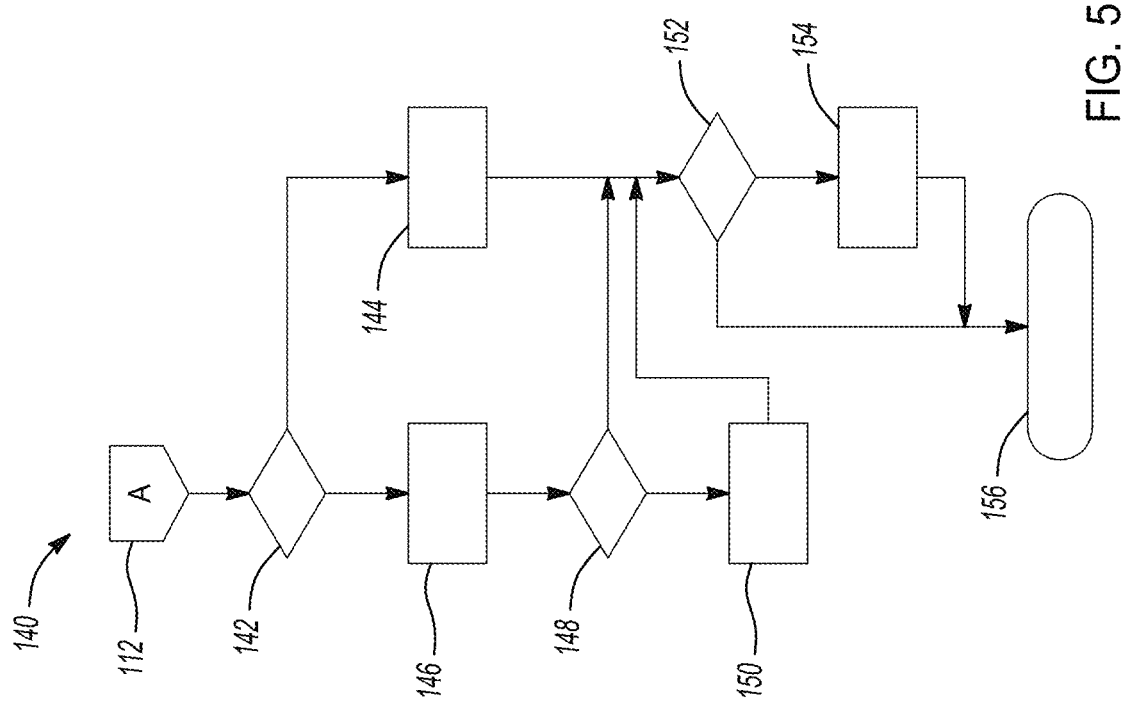
FIG. 5 is a flowchart of an alternative algorithm for detecting a drooping battery cell in the battery pack according to an exemplary embodiment.

FIG. 5 depicts steps of an exemplary algorithm 140 which may be performed as an alternative to the algorithm 120 depicted in FIG. 4 for identifying a drooping cell using the results determined in the algorithm 100 depicted in FIG. 3 as linked by connector block 112. Algorithm 140 includes a plurality of counters $C[1], C[2], \ldots, C[n]$, where each counter is associated with one of the n battery cells in the battery pack 40. In decision block 142, the absolute value of the residual value $e_i(t)$ calculated for the ith battery cell in step 106 in FIG. 3 is compared to a multiplier $k(I)$ times the standard deviation $\sigma(t)$ of the residuals calculated in step 108. If it is found in step 142 that $|e_i(t)| > k(I)\sigma(t)$, the corresponding counter C[i] for the ith battery cell is incremented in step 144, and the algorithm proceeds to step 152. Incrementing the counter C[i] may comprise adding 1 to the previous counter value. Alternatively, incrementing the counter C[i] may comprise adding a value such as $|e_i(t)|/k$ (I)σ(t) so that large residual values result in more rapid advance of the counter value C[i].

If it is found in step 142 that $|e_i(t)| \leq k(I)\sigma(t)$, the corresponding counter C[i] for the ith battery cell is decremented in step 146. In step 148 the decremented counter is checked to see if it has a negative value, and if not the algorithm proceeds to step 152. If the decremented counter has a negative value, the decremented counter is reset to zero in step 150. The algorithm then proceeds to step 152.

With continued reference to FIG. 5, in decision block 152 the value of the counter C[i] is compared to a predetermined diagnostic threshold. If the counter value exceeds the predetermined diagnostic threshold, a flag is set to identify the ith battery cell as a drooping cell. The algorithm exits at step 150. The algorithm steps 142 through 150 are performed for each of the n cells in the battery pack 40, and the entire process is repeated over a monitoring time window.

Figure 6:
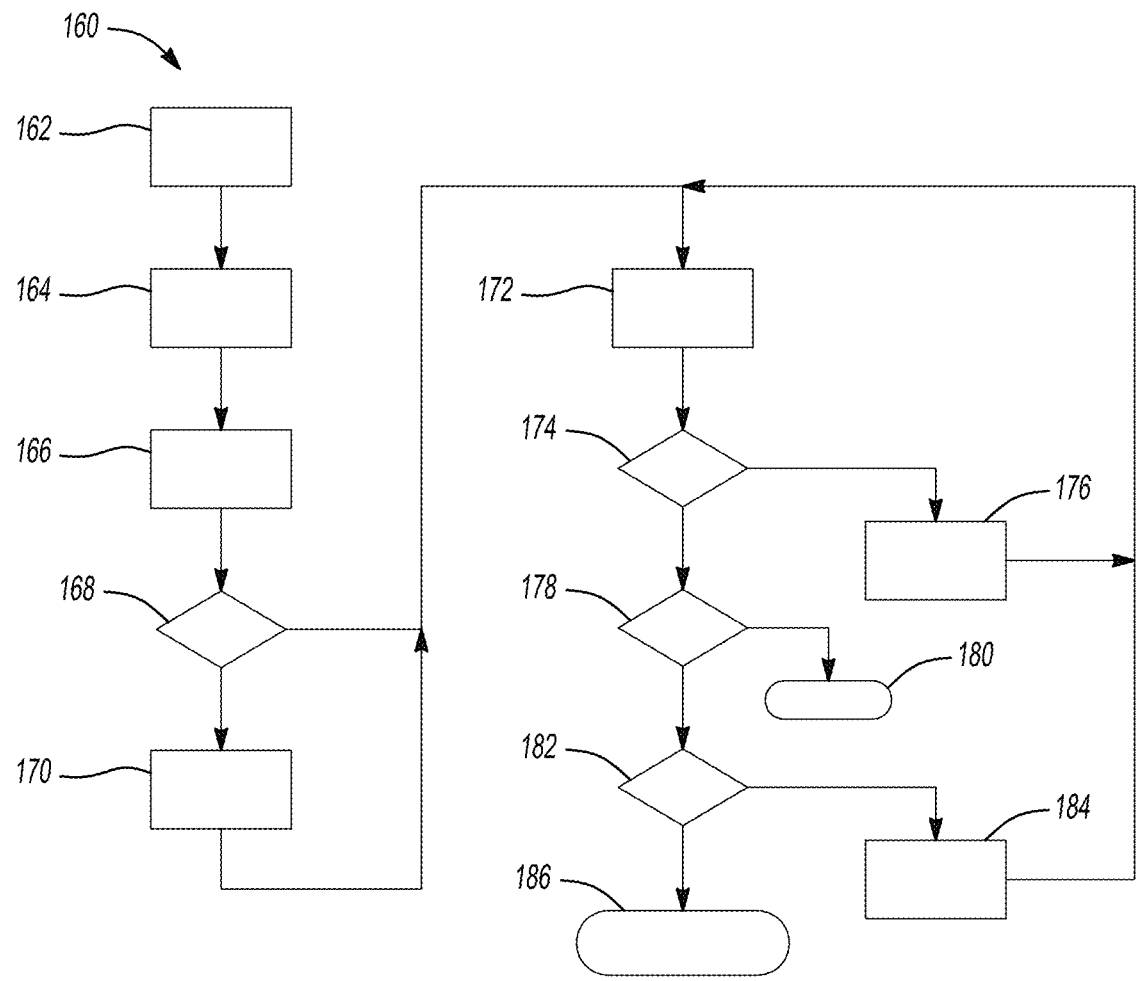
FIG. 6 is a flowchart of an algorithm for detecting a short-circuited battery cell in the battery pack according to an exemplary embodiment.

FIG. 6 is a flowchart of an algorithm 160 that can be used to identify thermal runaway conditions in a battery cell. At algorithm step 162 the battery cell voltage is measured for each of the n battery cells in the battery pack. In algorithm step 164 the battery cell having the lowest measured battery cell voltage is identified.

In the discussion related to the algorithm 160, the battery cell having the lowest measured battery cell voltage will be referred to as the jth battery cell. In algorithm step 166 Vc_m(t), a mean battery cell voltage for the (n−1) battery cells in the battery pack excluding the battery cell having the lowest measured cell voltage (the jth cell), is generally calculated as:

$$Vc\_m(t) = (\Sigma_{i=1}^{j-1} Vcell_i(t) + \Sigma_{i=j+1}^{n} Vcell_i(t))/(n-1)$$

If the first battery cell in the battery pack has the lowest measured battery cell voltage the mean battery cell voltage is calculated as:

$$Vc\_m(t) = \Sigma_{i=2}^{n} Vcell_i(t)/(n-1)$$

and if the last (nth) battery cell in the battery pack has the lowest measured battery cell voltage the mean battery cell voltage is calculated as: $Vc\_m(t) = \Sigma_{i=1}^{n-1} Vcell_i(t)/(n-1)$. The standard deviation σ(t) of the (n−1) battery cells in the battery pack excluding the battery cell having the lowest measured battery cell voltage (the jth cell) is also calculated in algorithm step 166.

The algorithm 160 then proceeds to step 168, which calculates $e_j(t) = Vcell_j(t) - Vc\_m(t)$ the numerical difference between the lowest measured battery cell voltage and the mean of the measured battery cell voltages excluding the lowest measured battery cell voltages. Additionally in step 168, a test is made to determine the extent to which the cell voltage of the jth battery cell is lower than the mean battery cell voltage of the remainder of the battery cells. If it is determined that $e_j(t) \geq -k(I)\sigma(t)$, where the predetermined multiplier k(I) is a function of current, this is an indication that the jth battery cell is not drooping significantly more than the battery pack as a whole, and the algorithm proceeds to step 170 where a timer is reset before proceeding to step 172. If it is determined that $e_j(t) < -k(I)\sigma(t)$, where the predetermined multiplier k(I) is a function of current, this is an indication that the jth battery cell is drooping significantly more than the battery pack as a whole, and the algorithm proceeds directly to step 172.

With continued reference to FIG. 6, in step 172 the timer is incremented. In decision step 174, if $|Vcell_j(t) - 0| \geq Vmin$ the algorithm proceeds to step 176 where $Vcell_j(t)$ is resampled, and the algorithm loops back to step 172. If $|Vcell_j(t) - 0| < Vmin$ the algorithm proceeds to step 178. The comparison value Vmin is a calibration value used to identify a short-circuited battery cell. As a non-limiting example Vmin may be set to 0.2 volts.

The algorithm 160 reaches step 178 if there is an indication that the jth cell may be short circuited. In step 178 a determination is made as to whether the timer value is less than a minimum value $t_{min}$ and the measured voltage of a cell adjacent to the jth cell is above a maximum threshold value $V_{max}$. As used herein, an adjacent cell refers to a cell that is located nearby the jth cell, including but not limited to cells that have a boundary that is in direct physical contact with a boundary of the jth cell. As a non-limiting example, $t_{min}$ may be a value of about 0.1 sec. As a non-limiting example, $V_{max}$ may be a value of about 5 volts. If the timer value is less than the minimum value $t_{min}$ and the measured voltage of a cell adjacent to the jth cell is above the maximum threshold value $V_{max}$, the algorithm proceeds to step 180, where a sensing fault is flagged. Otherwise the algorithm proceeds to step 182.

With continued reference to FIG. 6, in step 182 a determination is made as to whether the timer value is greater than a maximum value $t_{max}$ and the measured voltage of the battery cell adjacent to the jth cell is less than the mean battery cell voltage Vc_m(t) plus a value ε. In a non-limiting example the value ε may be set to k(I)σ(t) volts. In a non-limiting example the value of $t_{max}$ may be set to about 5 seconds. If the timer value is greater than a maximum value $t_{max}$ and the measured voltage of the battery cell adjacent to the jth cell is less than the mean battery cell voltage Vc_m(t) plus the value ε, a short-circuited cell is suspected, and the algorithm proceeds to step 186. Otherwise the algorithm proceeds to step 184. In step 184, the battery cell voltages of the jth cell and the adjacent cell are resampled, and the algorithm loops back to step 172.

If the algorithm reaches step 186, a short-circuited cell that may result in thermal runaway is suspected. In step 186, further measures may be taken to increase confidence in the thermal runaway diagnosis. By way of non-limiting example, cell voltages of battery cells in the vicinity can be checked for voltage droop which may be caused by thermal propagation from an overheating short-circuited cell. Alternatively or additionally, battery pack temperature, battery cell temperature, rate of rise of battery pack temperature, rate of rise of battery cell temperature, battery pack pressure, or rate of rise of battery pack pressure may be compared to predetermined threshold values and used as indications to confirm a diagnosis of thermal runaway in a battery cell in the battery pack. Appropriate actions may then be taken such as illuminating a display or activating an audible warning to alert a vehicle occupant of a possible thermal runaway condition and to evacuate the vehicle.

Degradation of a battery cell results in a decrease in available energy storage which may reduce the driving range or reduce the peak power available for vehicle acceleration. Degradation of a battery cell can also exhibit itself as an increase in the internal cell resistance. Referring back to FIG. 1, under steady state constant current or quasi steady state charging conditions, the battery cell voltage can be expressed as V(t)=Voc+I*Rdl+I*Rdiff+I*Rm+I*Rsys, where Rsys is the resistance of connectors and wiring associated with the battery cell. As used herein the term "quasi steady state" refers to fluctuations of less than 10% during the time period being considered. The total battery cell resistance Rcell can be expressed as Rcell=Rdl+Rdiff+Rm+Rsys=(V(t)−Voc)/I. A battery cell resistance can thus be estimated in a rolling window as.

$$Rcell = \sum_{i=1}^{n} \frac{(V(t_i) - V_{oc}(t_i))}{I},$$

where n represents the number of time samples in the rolling window, and $V(t_i)$ and $V_{oc}(t_i)$ are the sampled cell voltage and sampled cell open circuit voltage respectively.

As an alternative to employing a rolling window type calculation for estimating cell resistance at constant current charging or discharging, the equivalent circuit model shown in FIG. 1 is simplified to $$R(t_{i+1}) = R(t_i) + \varepsilon(t_i)$$

$$V(t_{i+1}) = IR(t_i) + V_{oc}(t_i) + \zeta(t_i)$$

where $R(t_i)$ represents total cell resistance at sample time $t_i$, $V(t_{i+1})$ represents sampled cell terminal voltage, and $V_{oc}(t_i)$ is the sampled cell open circuit voltage, $\varepsilon(t_i)$ and $\zeta(t_i)$ are process and measurement noises. With this model, standard Kalman filter or recursive least square estimation algorithm can be applied to estimate the cell resistance R.

Information about increased resistance in a battery cell or a battery pack may be used to enhance operation of an electric vehicle. Depending on the severity level of the resistance increase, possible responses include but are not limited to inhibiting fast charging of the battery to prevent further battery degradation, derating vehicle power, recalculating a value remaining vehicle range displayed to the vehicle operator, and indicating a need to service the vehicle.

A method for determining the state of health of an electric battery of the present disclosure offers several advantages. The ability to identify degradation at a battery cell level using the disclosed method may allow earlier detection of a weak cell. Appropriate action depending on the severity of a battery cell degradation may then be taken, including but not limited to inhibiting or derating fast charging of the battery to prevent further battery degradation, derating vehicle power, recalculating a value remaining vehicle range displayed to the vehicle operator, and indicating a need to service the vehicle. The ability to identify a short-circuited battery cell using the disclosed method may allow earlier detection of a thermal runaway condition, allowing more time to alert vehicle occupants to exit the vehicle. Additionally, identification of which particular battery cell in a battery pack is weak may enable replacement of a single module in a modular battery pack, and may enable remanufacturing of a battery pack by replacing weak battery cells.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A method for determining a state of health of an electric battery pack, the battery pack comprising a plurality of battery cells, the method comprising the steps of:
   measuring the cell voltage of each individual battery cell of the plurality of battery cells; and
   analyzing each measured battery cell voltage to determine the state of health of the corresponding battery cell, wherein analyzing each measured battery cell voltage comprises:
   determining the mean of the individual measured cell voltages in the battery pack;
   determining a residual voltage value for each of the individual battery cells, wherein the residual voltage value is calculated as the numerical difference between the measured voltage for the particular individual battery cell and the determined mean;
   calculating the standard deviation of the determined residual voltage values at each measurement time;
   identifying an outlier battery cell as a battery cell whose residual voltage value exceeds a predetermined multiple of the standard deviation for a predetermined period of time; and
   performing a first action upon identifying at least one outlier battery cell.

2. The method of claim 1, wherein the first action comprises setting a diagnostic indicator.

3. The method of claim 1, wherein the first action comprises derating maximum power delivered from the battery.

4. The method of claim 1, wherein the first action comprises calculating a reduced value of remaining energy available from the battery based on an estimate of energy available from the outlier battery cell.

5. The method of claim 1, wherein the first action comprises reducing an allowable charging rate of the battery compared to a charging rate that is allowed for a battery having no outlier battery cells.

6. The method of claim 1, wherein the first action comprises:
   determining a second mean as the mean of the individual measured voltages excluding voltages associated with all battery cells identified as outlier battery cells;
   determining a second residual voltage value for each of the battery cells not identified as outlier battery cells, wherein the second residual voltage value is calculated as the numerical difference between the measured voltage for the particular non-outlier individual battery cell and the determined second mean;
   calculating a second standard deviation at each measurement time as the standard deviation of the determined second residual voltage values for the non-outlier battery cells;
   identifying a drooping cell as a battery cell whose second residual voltage value exceeds a predetermined multiple of the second standard deviation; and
   performing a second action upon identifying at least one drooping cell.

7. The method of claim 6, wherein the second action comprises setting a diagnostic indicator.

8. The method of claim 6, wherein the second action comprises derating maximum power delivered from the battery.

9. The method of claim 6, wherein the second action comprises calculating a reduced value of remaining energy available from the battery based on an estimate of energy available from the drooping cell.

10. The method of claim 6, wherein the second action comprises reducing an allowable charging rate of the battery compared to a charging rate that is allowed for a battery having no drooping cells.

11. The method of claim 1, wherein analyzing each measured battery cell voltage comprises:
   estimating a battery cell resistance value during constant charging or discharging conditions using a rolling average algorithm, a Kalman filter, or a recursive least square algorithm, and
   performing a second action if the estimated battery cell resistance value exceeds a predetermined threshold.

12. The method of claim 11, wherein the second action comprises setting a diagnostic indicator.

13. The method of claim 11, wherein the second action comprises derating maximum power delivered from the battery.

14. The method of claim 11, wherein the second action comprises calculating a reduced value of remaining energy available from the battery.

15. The method of claim 11, wherein the second action comprises reducing an allowable charging rate of the battery compared to a charging rate that is allowed for a battery having no cells with an estimated battery cell resistance value exceeding the predetermined threshold.

16. A method for determining a state of health of an electric battery pack, the battery pack comprising a plurality of battery cells, the method comprising the steps of:
measuring the cell voltage of each individual battery cell of the plurality of battery cells; and
analyzing each measured battery cell voltage to determine the state of health of the corresponding battery cell, wherein analyzing each measured battery cell voltage comprises:
identifying a battery cell corresponding to the lowest measured battery cell voltage of the plurality of battery cells;
determining whether the battery cell corresponding to the lowest measured battery cell voltage has an output voltage that remains below a predetermined threshold voltage for a time duration greater than a predetermined threshold time duration; and
performing a first action when the battery cell corresponding to the lowest measured battery cell voltage has an output voltage that remains below the predetermined threshold voltage for a time duration greater than the predetermined threshold time duration;
wherein the predetermined threshold voltage is a calibration value that is indicative of a short-circuited battery cell.

17. The method of claim 16, wherein the first action comprises analyzing the battery cell voltage of a battery cell adjacent to the battery cell corresponding to the lowest measured battery cell voltage to determine if the adjacent battery cell is showing indications of cell droop.

18. The method of claim 16, wherein the first action comprises comparing a battery pack temperature, a rate of rise of the battery pack temperature, a battery cell temperature, a rate of rise of the battery cell temperature, a battery pack pressure, and/or a rate of rise of the battery pack pressure to a predetermined threshold value.

19. The method of claim 16, wherein the first action comprises activating a warning signal.

20. The method of claim 16, wherein the first action comprises activating a diagnostic indicator.

* * * * *